United States Patent
Lim et al.

[11] Patent Number: 6,165,871
[45] Date of Patent: Dec. 26, 2000

[54] METHOD OF MAKING LOW-LEAKAGE ARCHITECTURE FOR SUB-0.18 μM SALICIDED CMOS DEVICE

[75] Inventors: Eng Hua Lim; Chong Wee Lim; Soh Yun Siah; Kong Hean Lee; Pei Ching Lee, all of Singapore, Singapore

[73] Assignee: Chartered Semiconductor Manufacturing Ltd., Singapore, Singapore

[21] Appl. No.: 09/356,003

[22] Filed: Jul. 16, 1999

[51] Int. Cl.[7] .................................................. H01L 21/762
[52] U.S. Cl. ............................................. 438/437; 438/424
[58] Field of Search .................................... 438/424, 437, 438/FOR 227, 696, 700

[56] References Cited

U.S. PATENT DOCUMENTS

| | | |
|---|---|---|
| 5,637,529 | 6/1997 | Jang et al. . |
| 5,731,221 | 3/1998 | Kwon . |
| 5,753,562 | 5/1998 | Kim . |
| 5,780,325 | 7/1998 | Lee . |
| 5,795,811 | 8/1998 | Kim et al. . |
| 5,834,360 | 11/1998 | Tesauro et al. . |
| 5,895,253 | 4/1999 | Akram . |
| 6,020,030 | 2/2000 | Wu . |

*Primary Examiner*—George Fourson
*Attorney, Agent, or Firm*—George O. Saile; Rosemary L. S. Pike

[57] ABSTRACT

A method for forming a stepped shallow trench isolation is described. A pad oxide layer is deposited on the surface of a semiconductor substrate. A first nitride layer is deposited overlying the pad oxide layer. The first nitride layer is etched through where it is not covered by a mask to provide an opening to the pad oxide layer. A first trench is etched through the pad oxide layer within the opening and into the semiconductor substrate. A second nitride layer is deposited overlying the first nitride layer and filling the first trench. Simultaneously, the second nitride layer is anisotropically etched to form nitride spacers on the sidewalls of the first trench and the semiconductor substrate is etched into where it is not covered by the spacers to form a second trench. Ions are implanted into the semiconductor substrate underlying the second trench. The first and second trenches are filled with an oxide layer. Thereafter, the first nitride and pad oxide layers are removed completing the formation of shallow trench isolation in the fabrication of an integrated circuit device. This nitride spacer STI architecture prevents STI corner oxide recess and enables borderless contact formation. This unique process reduces junction leakage and also reduces contact leakage.

26 Claims, 7 Drawing Sheets

METHOD OF MAKING LOW-LEAKAGE ARCHITECTURE FOR SUB-0.18 μM SALICIDED CMOS DEVICE

BACKGROUND OF THE INVENTION

(1) Field of the Invention

The present invention relates to the fabrication of integrated circuit devices, and more particularly, to a method of forming a low-leakage shallow trench isolation (STI) in the fabrication of integrated circuits.

(2) Description of the Prior Art

As device technology is scaled down to the quarter micron regime and below, the use of the conventional local oxidation of silicon (LOCOS) isolation will be confined by smaller channel-width encroachment (bird's beak). Shallow trench isolation (STI) can be used to eliminate these encroachments, especially in ultra large scale integrated (ULSI) circuit devices.

However, in forming shallow trench isolation regions, after the trench has been filled, the removal of the pad oxide also results in the removal of the corner regions of the shallow trench isolation (STI) region causing corner recesses, as shown in FIG. 1. STI region 20 formed in the semiconductor substrate 10 has corner recesses 25. This results in a sharp corner 27 at the edge of the active area which will lead to a high electric field and leakage current. Polysilicon gate 30 is shown in a lateral view. When the polysilicon gate runs over the sharp corner 27 the high electric field problem occurs. This is also known as "poly wrap-around effect."

Also, this results in subthreshold humps in the MOS transistors formed in the active regions. The subthreshold hump 21 is an abnormal MOS device $I_D$-$V_G$ curve caused by the high electric field built up at the sharp STI corner 27, as illustrated in FIG. 2. FIG. 2 illustrates gate electrode voltage $V_G$ as a function of saturation current $I_D$. The high electric field results in the "$V_A$-kmk" phenomenon, shown by 21, which results in a higher subthreshold leakage current and difficulty in controlling the threshold voltage.

A second problem is illustrated in FIG. 3. After silicidation 32 of the source/drain region 34, the recessed corners 25 allow junction leakage 35. A third problem occurs when forming a borderless contact, as shown in FIG. 4. Polysilicon contact 40 is formed over the STI region; resulting in gouging into the STI region and causing excessive contact leakage current 41.

A number of patents have addressed the formation of shallow trenches. U.S. Pat. No. 5,834,360 to Tesauro et al teaches etching a trench within a substrate, forming a silicon etch stop layer within the trench, and silicon nitride spacers on the sidewalls of the trench, and then oxidizing the silicon to form a field oxide region within the trench. U.S. Pat. No. 5,637,529 to Jang et al teaches forming silicon nitride spacers on the sidewalls of a patterned silicon nitride layer and then etching a trench into the substrate between the spacers. Germanium is ion implanted underlying the trench and a field oxidation region is formed within the trench. U.S. Pat. No. 5,780,325 to Lee forms an ion implanted region in a substrate, forms spacers on the sidewalls of an opening in an insulating layer over the implanted region, etches a trench through the implanted region, leaving implanted areas under the spacers at the sidewalls of the trench, and then fills the trench. U.S. Pat. No. 5,795,811 to Kim et al forms spacers on the sidewalls of an opening in an insulating layer and etches a trench between the spacers into the substrate. A two-step trench fill and etch back completes the isolation region. U.S. Pat. No. 5,753,562 to Kim teaches an STI method in which a trench is filled with layers of silicon nitride and oxide. The substrate is flipped over wherein the bottom of the trench becomes the top of the trench to prevent corner recesses.

SUMMARY OF THE INVENTION

Accordingly, the primary object of the invention is to provide a process for forming shallow trench isolation in the fabrication of integrated circuits.

A further object of the invention is to provide a process for forming shallow trench isolation which prevents shallow trench isolation field edge exposure.

Another object of the invention is to provide a process for forming shallow trench isolation in which there is a smooth transition between active areas and the isolation region.

Yet another object of the invention is to provide a process for forming a stepped shallow trench isolation.

A still further object of the invention is to provide a process for forming a stepped shallow trench isolation having a reduced nitride spacer width.

Yet another object is to provide a process for forming a stepped shallow trench isolation with channel field implants to reduce isolation leakage.

Yet another object is to provide a process for forming a stepped shallow trench isolation with a blocking nitride spacer and channel field implants to reduce isolation leakage.

A still further object is to provide a process for forming a self-aligned nitride spacer which acts as an etch-stopping layer for borderless contact formation to minimize contact leakage.

In accordance with the objects of the invention, a method for forming a stepped shallow trench isolation is achieved. A pad oxide layer is deposited on the surface of a semiconductor substrate. A first nitride layer is deposited overlying the pad oxide layer. The first nitride layer is etched through where it is not covered by a mask to provide an opening to the pad oxide layer. A first trench is etched through the pad oxide layer within the opening and into the semiconductor substrate. A second nitride layer is deposited overlying the first nitride layer and filling the first trench. Simultaneously, the second nitride layer is anisotropically etched to form nitride spacers on the sidewalls of the first trench and the semiconductor substrate is etched into where it is not covered by the spacers to form a second trench. Ions are implanted into the semiconductor substrate underlying the second trench. The first and second trenches are filled with an oxide layer. Thereafter, the first nitride and pad oxide layers are removed completing the formation of shallow trench isolation in the fabrication of an integrated circuit device. This nitride spacer STI architecture prevents STI corner oxide recess and enables borderless contact formation. This unique process reduces junction leakage and also reduces contact leakage.

BRIEF DESCRIPTION OF THE DRAWINGS

In the accompanying drawings forming a material part of this description, there is shown.

DESCRIPTION OF THE PREFERRED EMBODIMENTS

The process of the present invention provides a stepped shallow trench isolation (STI) which prevents STI field edge exposure which would lead to high field edge junction leakage. A thin blocking nitride spacer is used in the process of the invention. The presence of this spacer allows for channel field implants to reduce isolation leakage. This is especially important in devices having feature sizes of 0.18 $\mu$m and below. The process of the invention will be described with reference to FIGS. 5 through 13.

Figure 5:
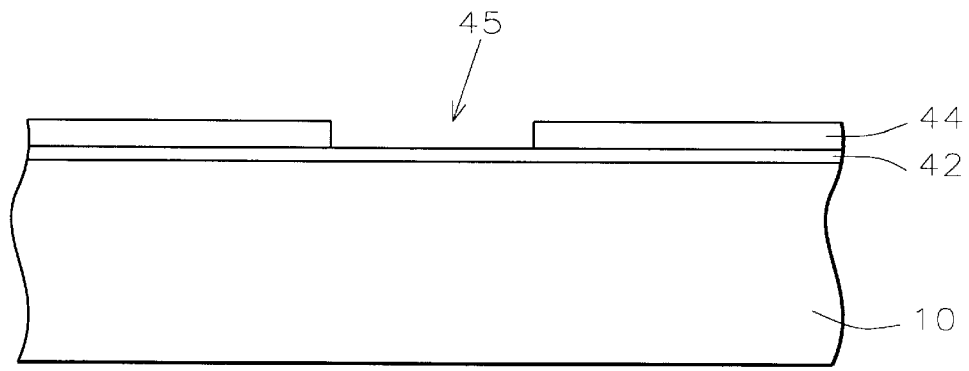
FIGS. 5 through 13 are cross-sectional representations of a preferred embodiment of the present invention.

Referring now more particularly to FIG. 5, there is shown a semiconductor substrate 10. A layer of pad silicon oxide 42 is grown on the surface of the semiconductor substrate to a thickness of between about 50 and 200 Angstroms. A layer of silicon nitride 44 is deposited over the pad oxide layer 12 to a thickness of between about 1000 and 2000 Angstroms.

A photoresist mask, not shown, is formed over the surface of the nitride layer with an opening where the shallow trench isolation region is to be formed. Using conventional photolithography and etching techniques, the nitride layer is etched to leave an opening 45 where the isolation region is to be formed.

Figure 6:
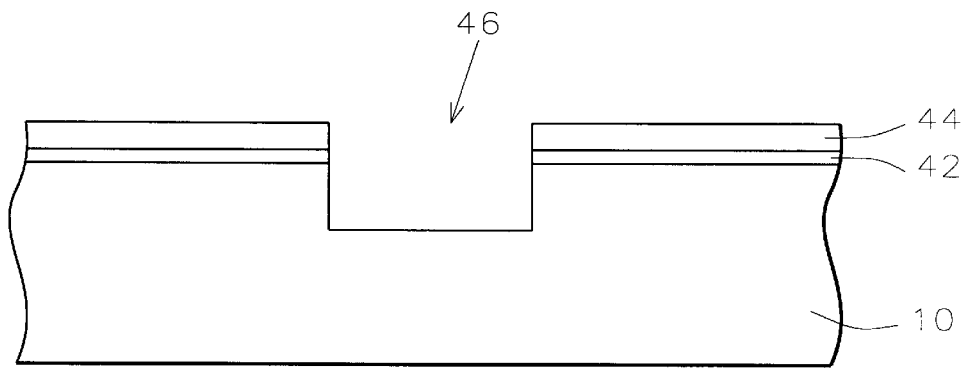

Referring now to FIG. 6, using the silicon nitride as a hard mask, the pad oxide layer and the semiconductor substrate exposed within the opening are etched into to a depth of between about 2000 and 3500 Angstroms to form a trench 46.

Figure 7:
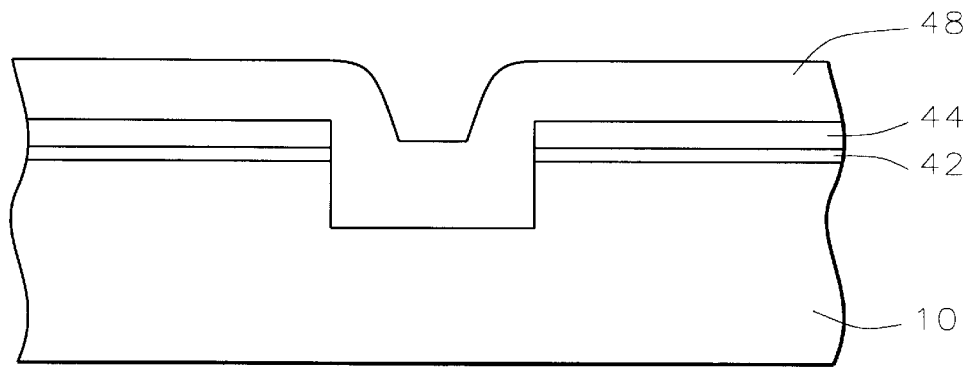

Referring now to FIG. 7, a blanket deposition of silicon nitride 48 is made over the surface of the substrate and within the trench. The silicon nitride layer is deposited to a thickness of between about 300 and 1000 Angstroms.

Figure 8:
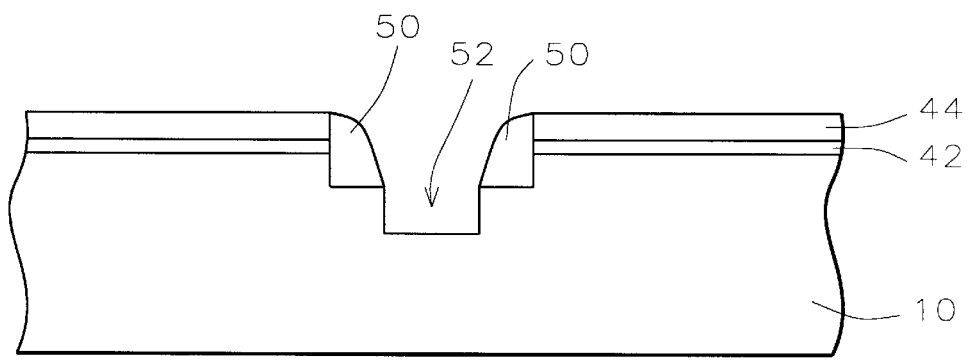
Figure 9:
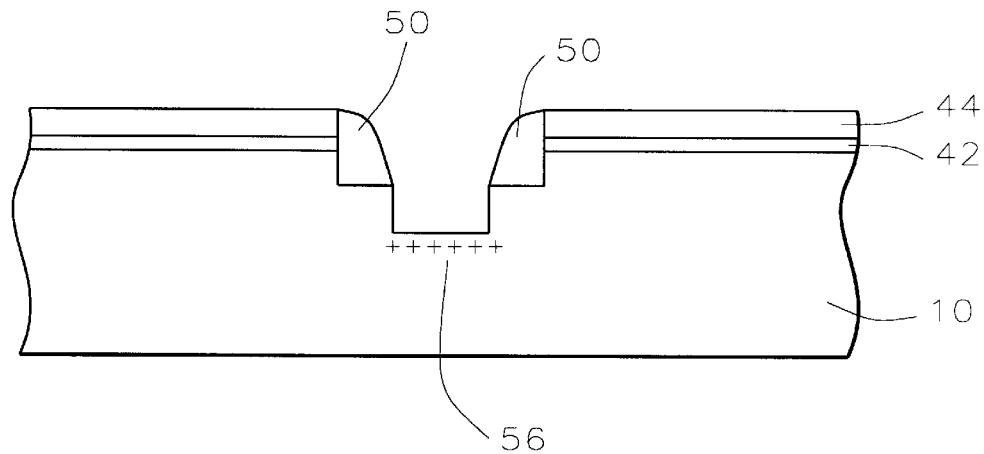

As illustrated in FIG. 8, the silicon nitride layer 48 is anisotropically etched to leave spacers 50 on the sidewalls of the trench 46. This etch step also simultaneously etches a deeper trench 52 into the substrate under that part of the trench 46 not covered by the nitride spacers 50. This trench 52 has a depth of between about 500 and 2500 Angstroms. The silicon nitride spacers have a width of between about 300 and 1000 Angstroms.

Now, a reverse NMOS-PMOS field implant mask, not shown, is formed over the substrate and ions are implanted into the semiconductor substrate underlying the deep trench 52 to prevent leakage. The field implant region 56, shown in FIG. 9, will be either N+ or P+ depending upon the nearby devices. For example, an N+ field implant may comprise boron or $BF_2$ ions implanted at a dosage of between about $1 \times 10^{11}$ and $1 \times 10^{13}$ atoms/cm$^2$ at an energy of 30 to 80 KeV. A P+ field implant may comprise phosphorus or arsenic ions implanted at a dosage of between about $1 \times 10^{11}$ and $1 \times 10^{13}$ atoms/cm$^2$ at an energy of 30 to 80 KeV.

Figure 10:
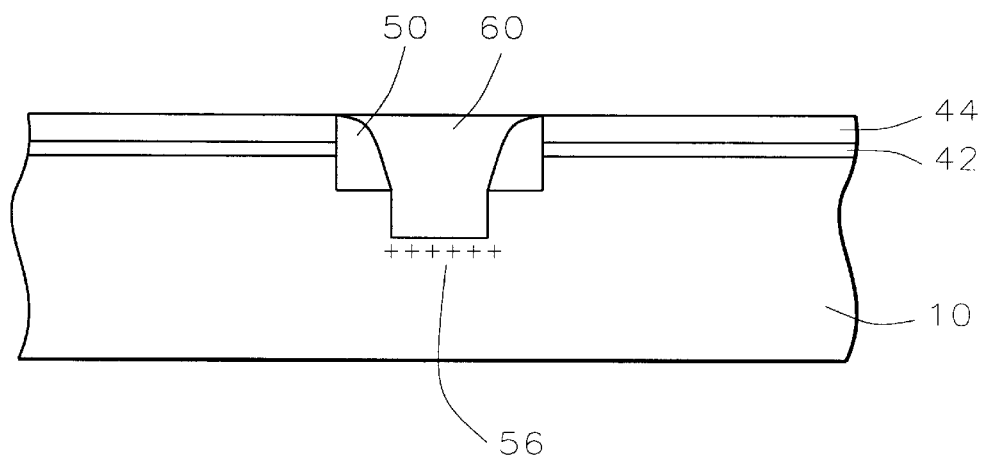

An oxide layer is deposited by CVD over the surface of the substrate and filling the trench. The oxide layer may have a thickness of between about 4000 and 8000 Angstroms. The oxide layer is polished using CMP with a polish stop at the nitride layer 44. The resulting STI region 60 is illustrated in FIG. 10.

Figure 11:
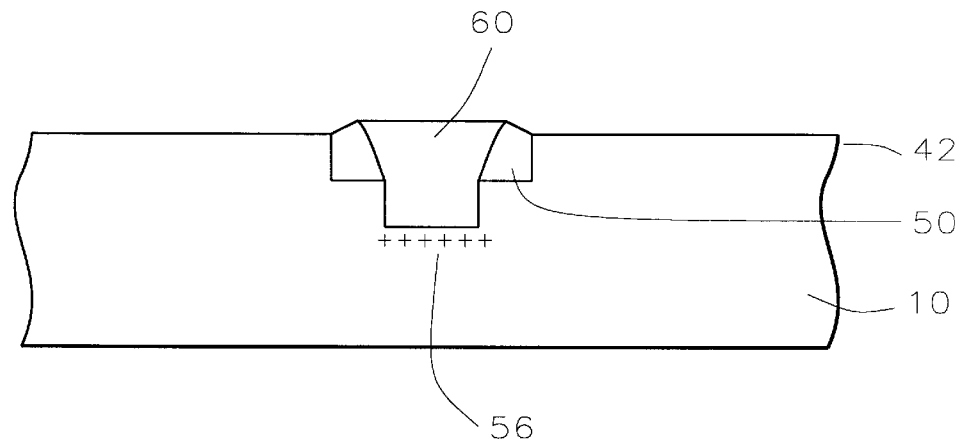

Now, the silicon nitride layer 44 is removed using a plasma etchback. Since plasma etchback is directional, the nitride spacers 50 are protected by the oxide layer 60 and not removed. Next, the pad oxide 42 is removed. This results in smoothing the corners of the nitride spacers 50, as shown in FIG. 11.

Figure 12:
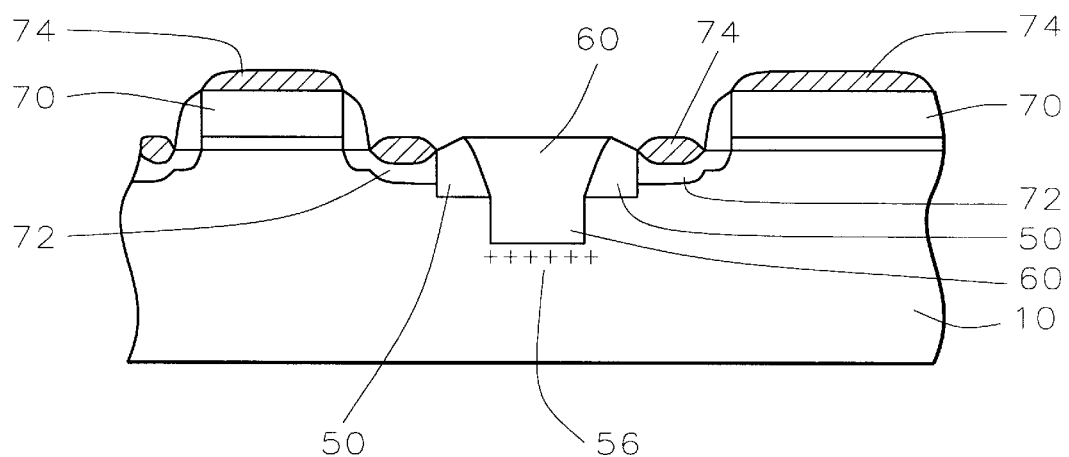

Processing continues as is conventional in the art. For example, as illustrated in FIG. 12, a gate oxide and a polysilicon layer are deposited over the surface of the substrate and patterned to form gate electrodes 70. Source and drain regions 72 associated with the gate electrodes 70 may be formed in the active regions between isolation regions as is conventional in the art. The gate electrodes and source/drain regions may be silicided 74, as is conventional.

Figure 1:
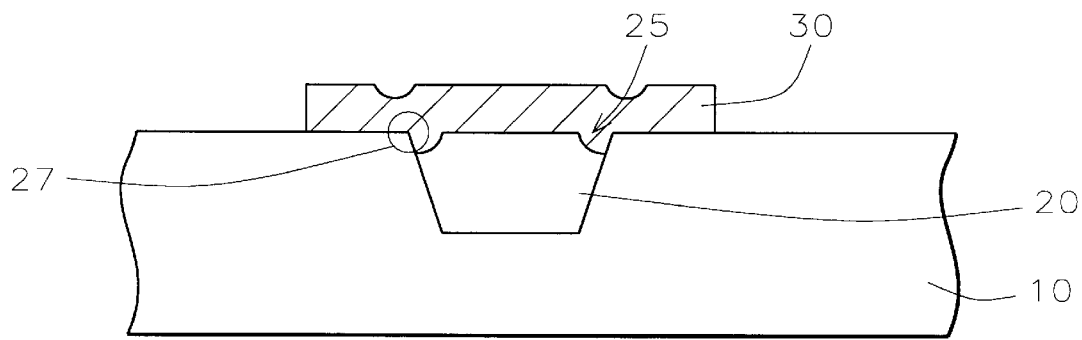
FIGS. 1, 3, and 4 are cross-sectional representations of an embodiment of the prior art.
Figure 2:
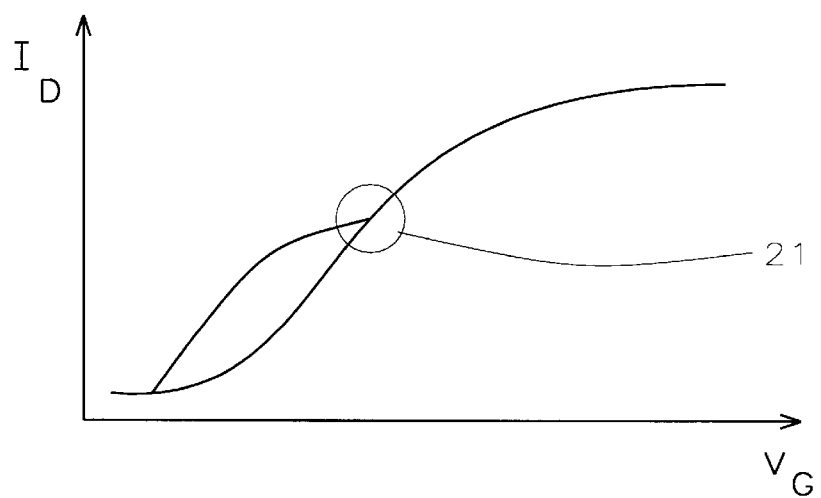
FIG. 2 is a graphical representation of $V_A$-kmk phenomenon existing in STI of the prior art having excessive corner oxide recesses.
Figure 3:
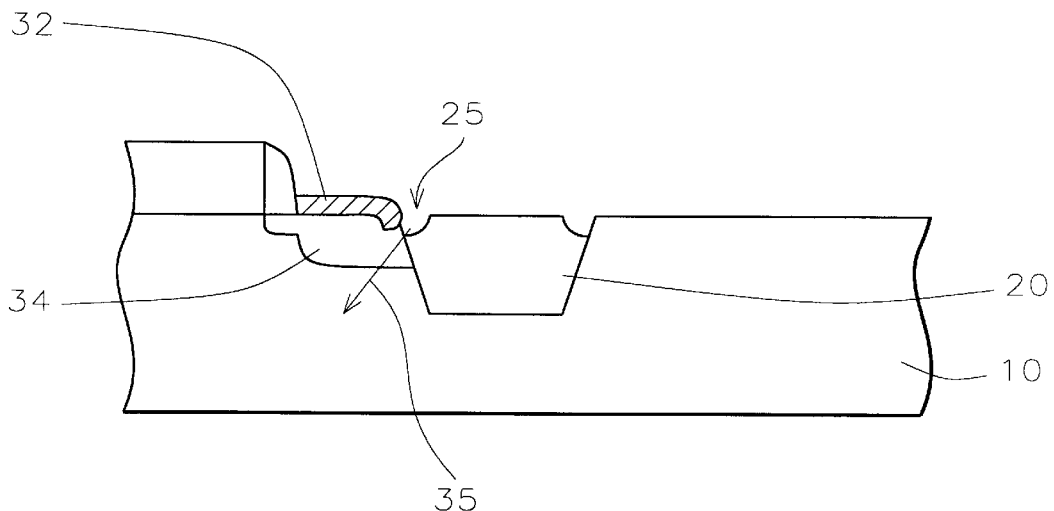

There is no junction leakage after silicidation in the process of the invention. As shown in FIG. 3, the junction leakage 35 occurs because the corner recess 25 of the STI region allows current to pass from an overlying conducting layer, not shown, into the substrate at the source/drain region 34. In the process of the invention, as shown in FIG. 12, the recess 65 is bounded by the silicon nitride spacer 50.

Figure 4:
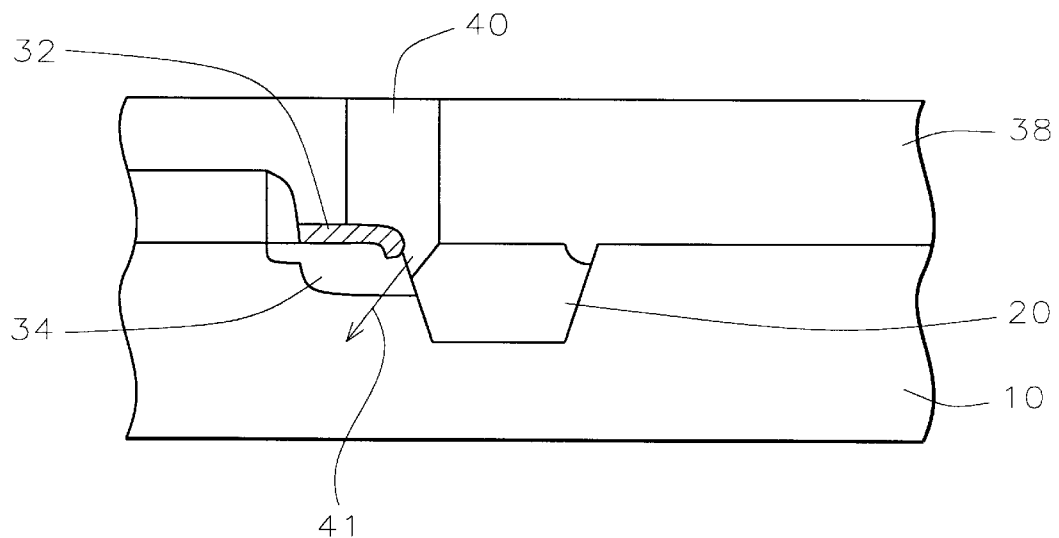
Figure 13:
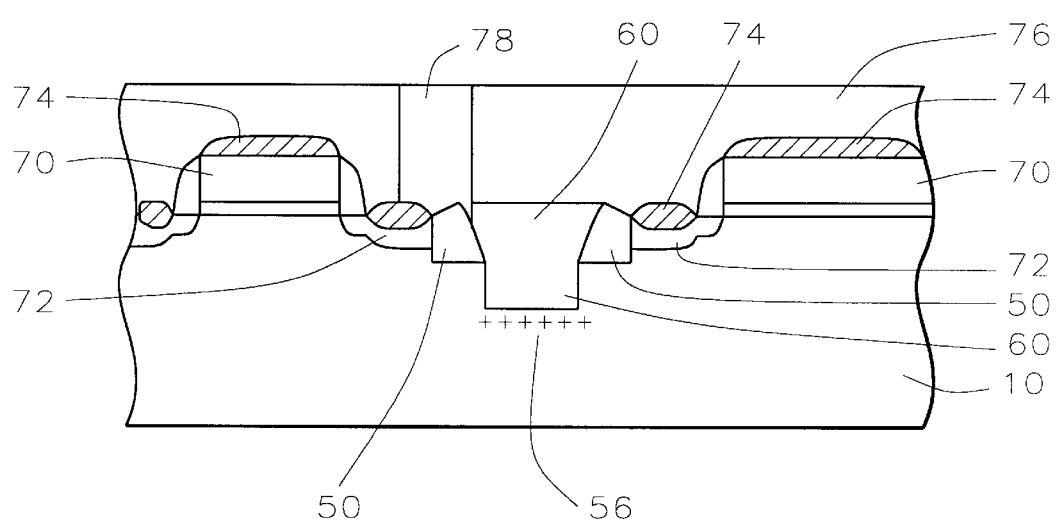

FIG. 13 illustrates the formation of a borderless contact 78. The normal process does not allow a borderless contact. Since the interlevel dielectric layer 76 and the STI 60 are both oxides, contact etching will result in excessive STI oxide loss (as shown in FIG. 4). However, in the process of the present invention, the nitride spacer 50 at the STI-active area junction acts as an etch stop to prevent STI oxide gouging. Therefore, contact leakage is minimized.

The process of the present invention results in the formation of a stepped shallow trench isolation (STI). The STI field edge exposure is prevented by the presence of the thin nitride spacers. This in turn prevents high field edge junction leakage after salicidation. The stepped STI with blocking silicon nitride spacers allows channel field implants to reduce isolation leakage especially in devices with feature sizes of 0.18 $\mu$m and below. The borderless contact process is fully supported by the process of the invention.

While the invention has been particularly shown and described with reference to the preferred embodiments thereof, it will be understood by those skilled in the art that various changes in form and details may be made without departing from the spirit and scope of the invention.

What is claimed is:

1. A method of forming shallow trench isolation in the fabrication of an integrated circuit device comprising:

depositing a pad oxide layer on the surface of a semiconductor substrate;

depositing a first nitride layer overlying said pad oxide layer;

patterning said first nitride layer to provide an opening to said pad oxide layer;

etching a first trench through said pad oxide layer within said opening and into said semiconductor substrate;

depositing a second nitride layer overlying said first nitride layer and filling said first trench;

simultaneously anisotropically etching said second nitride layer to form nitride spacers on the sidewalls of said first trench and etching into said semiconductor substrate not covered by said spacers to form a second trench;

implanting ions into said semiconductor substrate underlying said second trench;

filling said first and second trenches with an oxide layer;

thereafter removing said first nitride and pad oxide layers completing said formation of said shallow trench isolation in said fabrication of said integrated circuit device.

2. The method according to claim 1 wherein said pad oxide layer has a thickness of between about 50 and 200 Angstroms.

3. The method according to claim 1 wherein said first nitride layer is deposited to a thickness of between about 1000 and 2000 Angstroms.

4. The method according to claim 1 wherein said first trench has a depth of between about 2000 and 3500 Angstroms.

5. The method according to claim 1 wherein said second nitride layer is deposited to a thickness of between about 300 and 1000 Angstroms.

6. The method according to claim 1 wherein said second trench has a depth of between about 500 and 2500 Angstroms.

7. The method according to claim 1 wherein said spacers have a width of between about 300 and 1000 Angstroms.

8. The method according to claim 1 wherein said step of simultaneously anisotropically etching said second nitride layer and said semiconductor substrate is performed using anisotropic plasma etching.

9. The method according to claim 1 wherein said step of implanting ions comprises implanting boron or $BF_2$ ions at a dosage of between about $1 \times 10^{11}$ and $1 \times 10^{13}$ atoms/cm$^2$ at an energy of 30 to 80 KeV to form an N+ field implant region underlying said shallow trench isolation.

10. The method according to claim 1 wherein said step of implanting ions comprises implanting phosphorus or arsenic ions at a dosage of between about $1 \times 10^{11}$ and $1 \times 10^{13}$ atoms/cm$^2$ at an energy of 30 to 80 KeV to form a P+ field implant region underlying said shallow trench isolation.

11. The method according to claim 1 wherein said step of filling said first and second trenches comprises:

depositing an oxide layer by low pressure chemical vapor deposition to a thickness of between about 4000 and 8000 Angstroms; and polishing said oxide layer using chemical mechanical polishing with a polish stop at said first nitride layer.

12. The method according to claim 1 further comprising fabricating semiconductor device structures in and on said semiconductor substrate between said shallow trench isolation.

13. A method of forming shallow trench isolation in the fabrication of an integrated circuit device comprising:

depositing a pad oxide layer on the surface of a semiconductor substrate;

depositing a first nitride layer overlying said pad oxide layer;

patterning said first nitride layer to provide an opening to said pad oxide layer;

etching a first trench through said pad oxide layer within said opening and into said semiconductor substrate;

depositing a second nitride layer overlying said first nitride layer and filling said first trench;

simultaneously anisotropically etching said second nitride layer to form nitride spacers on the sidewalls of said first trench and etching into said semiconductor substrate not covered by said spacers to form a second trench;

implanting ions into said semiconductor substrate underlying said second trench to form a channel field implant;

depositing an oxide layer overlying said first nitride layer and filling said first and second trenches;

polishing said oxide layer with a polish stop at said first nitride layer; thereafter removing said first nitride and pad oxide layers wherein said nitride spacers block leakage through exposed corners of said oxide layer within said first and second trenches completing said formation of said shallow trench isolation in said fabrication of said integrated circuit device.

14. The method according to claim 13 wherein said pad oxide layer has a thickness of between about 50 and 200 Angstroms.

15. The method according to claim 13 wherein said first nitride layer is deposited to a thickness of between about 1000 and 2000 Angstroms.

16. The method according to claim 13 wherein said first trench has a depth of between about 2000 and 3500 Angstroms.

17. The method according to claim 13 wherein said second nitride layer is deposited to a thickness of between about 300 and 1000 Angstroms.

18. The method according to claim 13 wherein said second trench has a depth of between about 500 and 2500 Angstroms.

19. The method according to claim 13 wherein said spacers have a width of between about 300 and 1000 Angstroms.

20. The method according to claim 13 wherein said step of simultaneously anisotropically etching said second nitride layer and said semiconductor substrate is performed using anisotropic plasma etching.

21. The method according to claim 13 wherein said step of implanting ions comprises implanting boron or $BF_2$ ions at a dosage of between about $1 \times 10^{11}$ and $1 \times 10^{13}$ atoms/cm$^2$ at an energy of 30 to 80 KeV to form an N+ field implant region underlying said shallow trench isolation.

22. The method according to claim 13 wherein said step of implanting ions comprises implanting phosphorus or arsenic ions at a dosage of between about $1 \times 10^{11}$ and $1 \times 10^{13}$ atoms/cm$^2$ at an energy of 30 to 80 KeV to form a P+ field implant region underlying said shallow trench isolation.

23. The method according to claim 13 further comprising fabricating semiconductor device structures in and on said semiconductor substrate between said shallow trench isolation.

24. A method of forming shallow trench isolation in the fabrication of an integrated circuit device comprising:

depositing a pad oxide layer on the surface of a semiconductor substrate;

depositing a first nitride layer overlying said pad oxide layer;

patterning said first nitride layer to provide an opening to said pad oxide layer;

etching a first trench through said pad oxide layer within said opening and into said semiconductor substrate;

depositing a second nitride layer overlying said first nitride layer and filling said first trench;

simultaneously anisotropically plasma etching said second nitride layer to form nitride spacers on the sidewalls of said first trench and etching into said semiconductor substrate not covered by said spacers to form a second trench;

implanting ions into said semiconductor substrate underlying said second trench to form a channel field implant;

depositing an oxide layer overlying said first nitride layer and filling said first and second trenches;

polishing said oxide layer with a polish stop at said first nitride layer;

thereafter removing said first nitride and pad oxide layers wherein said nitride spacers block leakage through exposed corners of said oxide layer within said first and second trenches completing said formation of said shallow trench isolation;

forming gate electrodes and associated source and drain regions between said shallow trench isolation; and siliciding said gate electrodes and said source and drain regions to complete fabrication of said integrated circuit device.

25. The method according to claim 24 wherein said first and second trenches have a combined depth of between about 2500 and 6000 Angstroms.

26. The method according to claim 24 wherein said spacers have a width of between about 300 and 1000 Angstroms.

* * * * *